United States Patent
Jin et al.

(10) Patent No.: US 12,007,554 B2
(45) Date of Patent: Jun. 11, 2024

(54) SELF-ALIGNED VERTICAL COMB DRIVE ASSEMBLY

(71) Applicant: Lumentum Operations LLC, San Jose, CA (US)

(72) Inventors: Wenlin Jin, Ottawa (CA); Gonzalo Wills, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 519 days.

(21) Appl. No.: 16/917,399

(22) Filed: Jun. 30, 2020

(65) Prior Publication Data

US 2021/0239966 A1    Aug. 5, 2021

Related U.S. Application Data

(60) Provisional application No. 62/967,930, filed on Jan. 30, 2020.

(51) Int. Cl.
  *G02B 26/08* (2006.01)
  *B81B 3/00* (2006.01)
  *H02N 1/00* (2006.01)

(52) U.S. Cl.
  CPC ........ *G02B 26/0841* (2013.01); *B81B 3/0062* (2013.01); *H02N 1/008* (2013.01); *B81B 2201/033* (2013.01); *B81B 2203/0136* (2013.01); *B81B 2203/058* (2013.01)

(58) Field of Classification Search
  CPC .............. G02B 26/0841; B81B 3/0062; B81B 2201/033; B81B 2203/0136; B81B 2203/058; B81B 2201/042; H02N 1/008; B81C 1/00182

USPC .......................................... 310/309; 359/291
See application file for complete search history.

(56) References Cited

U.S. PATENT DOCUMENTS

| | | | |
|---|---|---|---|
| 6,384,952 B1 * | 5/2002 | Clark ..................... | G02B 26/06 |
| | | | 359/223.1 |
| 7,085,122 B2 | 8/2006 | Wu et al. | |
| 7,089,666 B2 | 8/2006 | Kim et al. | |
| 7,342,346 B2 * | 3/2008 | Kim ....................... | H02N 1/008 |
| | | | 359/224.1 |
| 7,357,874 B2 | 4/2008 | Moffat et al. | |
| 2002/0109894 A1 * | 8/2002 | Clark ..................... | G02B 26/06 |
| | | | 359/224.1 |
| 2003/0048036 A1 * | 3/2003 | Lemkin ................. | B81B 3/0037 |
| | | | 310/309 |
| 2006/0208608 A1 * | 9/2006 | Kim ....................... | H02N 1/008 |
| | | | 310/75 A |

(Continued)

*Primary Examiner* — John K Kim
(74) *Attorney, Agent, or Firm* — Harrity & Harrity, LLP (57) ABSTRACT

A vertical comb drive assembly may include a rotor assembly. The rotor assembly may include a comb anchor to attach the rotor assembly to a base, a comb rotor attached to the comb anchor, and a movable element attached to the comb rotor. The vertical comb drive assembly may include a stator assembly. The stator assembly may include a plate anchor to attach the stator assembly to the base, a plate, wherein the plate forms a comb stator, and a plate hinge to connect the plate to the plate anchor. The plate hinge and the plate may be configured for moving the plate from a first position where the comb rotor and the comb stator are both in a first plane to a second position where the comb rotor is in the first plane and the comb stator is in a second plane.

22 Claims, 4 Drawing Sheets

(56) References Cited

U.S. PATENT DOCUMENTS

| | | | |
|---|---|---|---|
| 2008/0284279 A1* | 11/2008 | Obi | G02B 26/0841 359/223.1 |
| 2009/0121584 A1* | 5/2009 | Nishimura | H03H 9/14541 310/313 B |
| 2011/0109194 A1* | 5/2011 | Hung | H02N 1/008 310/300 |
| 2011/0188104 A1* | 8/2011 | Tachibana | G02B 26/0841 310/309 |
| 2012/0019886 A1* | 1/2012 | Ebefors | B81B 7/0006 310/309 |
| 2012/0099176 A1* | 4/2012 | Zhou | G02B 26/00 359/291 |
| 2014/0125950 A1* | 5/2014 | Shimada | H02N 1/008 310/309 |
| 2015/0070941 A1* | 3/2015 | Suzuki | H02N 1/006 363/19 |
| 2021/0239966 A1* | 8/2021 | Jin | B81B 3/0062 |

* cited by examiner

SELF-ALIGNED VERTICAL COMB DRIVE ASSEMBLY

CROSS-REFERENCE TO RELATED APPLICATION

This Patent Application claims priority to U.S. Provisional Patent Application No. 62/967,930, filed on Jan. 30, 2020, and entitled "SELF-ALIGNED VERTICAL COMB DRIVER." The disclosure of the prior Application is considered part of and is incorporated by reference into this Patent Application.

TECHNICAL FIELD

The present disclosure relates generally to microelectromechanical systems and to vertical comb drives.

BACKGROUND

A vertical comb drive is a microelectromechanical system (MEMS) actuator that uses electrostatic forces for actuation. A vertical comb drive includes a rotor, which includes a first electrically conductive comb, and a stator, which includes a second electrically conductive comb. Based on applying an electrostatic force to the first and second electrically conductive combs, the vertical comb drive moves the rotor relative to the stator, which may be static. The electrically conductive combs may remain separated by a precisely calibrated gap to enable an electrostatic force to accurately actuate the electrically conductive combs. Vertical comb drives may be used for micro- or nano-scale control of other MEMS elements, such as MEMS optical elements in compact optical systems.

SUMMARY

According to some possible implementations, a vertical comb drive assembly may include a rotor assembly. The rotor assembly may include a comb anchor to attach the rotor assembly to a base, a comb rotor attached to the comb anchor, and a movable element attached to the comb rotor. The vertical comb drive assembly may include a stator assembly. The stator assembly may include a plate anchor to attach the stator assembly to the base, a plate, wherein the plate forms a comb stator, and a plate hinge to connect the plate to the plate anchor. The plate hinge and the plate may be configured for moving the plate from a first position to a second position, wherein, in the first position, the comb rotor and the comb stator are both in a first plane, and in the second position, the comb rotor is in the first plane and the comb stator is in a second plane that is parallel to the first plane.

According to some possible implementations, a method may include applying a first force to a vertical comb drive assembly to move a plate, of the vertical comb drive assembly, from a first position wherein a comb rotor, of the vertical comb drive assembly, and a comb stator, of the vertical comb drive assembly, are both in a first plane, to a second position wherein the comb rotor is in the first plane and the comb stator is in a second plane that is parallel to the first plane, wherein the first position is distal from a base of the vertical comb drive assembly and the second position is proximal to the base, wherein the comb stator is formed by the plate; and applying, after applying the first force to move the plate from the first position to the second position, a second force to the vertical comb drive assembly to actuate the comb rotor relative to the comb stator.

According to some possible implementations, a vertical comb drive assembly may include a base assembly. The base assembly may include a substrate and a spacer disposed on the substrate. The vertical comb drive assembly may include a rotor assembly. The rotor assembly may include comb anchor to attach the rotor assembly to the spacer and a comb rotor attached to the comb anchor, wherein the comb rotor includes a first set of fingers. The vertical comb drive assembly may include a stator assembly. The stator assembly may include a plate anchor to attach the stator assembly to the spacer, a plate, a plate hinge to connect the plate to the plate anchor, and a comb stator formed from the plate, wherein the comb stator includes a second set of fingers to interact with the first set of fingers. The plate hinge and the plate may be movable from a first position, wherein the comb rotor and the comb stator are both in a first plane, to a second position, wherein the comb rotor is in the first plane and the comb stator is in a second plane that is parallel to the first plane.

DETAILED DESCRIPTION

The following detailed description of example implementations refers to the accompanying drawings. The same reference numbers in different drawings may identify the same or similar elements.

As described above, a vertical comb drive may be used for micro- or nano-scale control of microelectromechanical system (MEMS) elements, such as MEMS optical elements in compact optical systems. To actuate such a MEMS element, the vertical comb drive may apply an electrostatic force to a stator comb and a rotor comb to drive (e.g., move) the rotor comb. In this case, a driving force of the vertical comb drive may be inversely proportional to a gap between fingers of the stator comb and fingers of the rotor comb. In other words, minimizing a gap between the stator comb and the rotor comb increases an available driving force to use to actuate a movable element attached to the vertical comb drive. However, if the gap is decreased to allow the fingers of the stator comb to touch the fingers of the rotor comb, an electric potential between the fingers of the stator comb and the fingers of the rotor comb equalizes. This eliminates the electrostatic force and, accordingly, the available driving force. Thus, a high level of alignment accuracy may be desirable for a vertical comb drive to minimize a gap between fingers of a stator comb and fingers of a rotor comb without allowing the fingers of the stator comb to touch the fingers of the rotor comb.

One technique to achieve a controlled gap for a comb drive is the use of a benzocyclobutene (BCB) reflowed hinge to separate stator fingers from rotor fingers. However, use of reflowed BCB may result in poor stability and difficulty in manufacturing such a comb drive. Another technique to achieve a controlled gap for a comb drive has been to mechanically deform the rotor and then to heat the rotor to a temperature above a glass transition temperature. This causes the mechanical deformation to become permanent. However, this too may result in difficulty in manufacturing such a comb drive and may limit material choices. For example, with such a technique, only movable elements that may tolerate temperatures above the glass transition temperature may be selected. Still another technique for achieving a controlled gap for a comb drive is to use multiple mask and etch processes on a silicon on insulator wafer. However, in this case, misalignments between the multiple masks may limit a minimum gap that may be achieved for the comb drive to greater than a threshold gap, which may limit driving force to less than a threshold force.

Some implementations described herein provide a self-aligned vertical comb drive. For example, the self-aligned vertical comb drive may use a hinged plate, which includes a comb stator that is alignable with an anchored comb rotor. In this case, a first force (e.g., an electrostatic force, an inertial force, an aerodynamic force, and/or the like) may be applied (e.g., temporarily applied) (e.g., during manufacturing or before use) to the self-aligned vertical comb drive to displace the hinged plate and achieve a desired separation between fingers of the comb stator and fingers of the comb rotor. Hinges of the plate may be configured to enable the desired separation to be an increase in vertical separation without displacement or with very minimal displacement in a horizontal direction. After applying the first force, the hinge plate may be held in position against lateral displacement by the horizontal stiffness of the hinge plates. After applying the first force, the hinge plate may be held in position against vertical displacement by various means, including surface adhesion to a substrate or base of the self-aligned vertical comb drive. After the plate has been vertically displaced, a second force (e.g., an actuating force) may be applied to actuate the comb rotor relative to the comb stator (e.g., operation of the device, angular rotation about a rotor hinge).

In some implementations, the first force may be applied during manufacturing or before use of the self-aligned vertical comb drive while the second force may be applied during operation of the self-aligned vertical comb drive. The first force may be applied vertically, or normal, to the plate or between the plate and a substrate or a base of the self-aligned vertical comb drive. The first force (e.g., an alignment force) may be applied to bring the hinged plate into a position parallel with the comb rotor with minimal change (e.g., less than or equal to 0.2% of the vertical separation) to the horizontal separation between a finger of the comb rotor and a corresponding finger of the comb stator. In some implementations, an electrostatic first force may provide a greater degree of reliability than a first force that is inertial or aerodynamic. The second force, which may include any subsequent actuating forces, may be an electrostatic force and may be applied between the comb rotor and the comb stator. In some embodiments, the first force and the second force may be applied in the same manner and to the same structures (e.g., an electrostatic force applied between the comb rotor and the comb stator).

Based at least in part on using hinges for the hinged plate with a threshold ratio of lateral stiffness to vertical stiffness, the displacement of the plate caused by the first force may occur in a vertical direction without variance in a lateral direction. The plate hinges may then also prevent lateral displacement of the plate during the lifespan of the self-aligned vertical comb drive (e.g., as a result of a shock, vibration, gravity, or the like). In this way, the plate hinges provide one degree of freedom of movement for the plate, which enables achievement of less than a threshold gap variation between fingers of the comb stator and comb rotor when the fingers are separated as a result of applying the first force. In some implementations, a lateral variation of the plate (or fingers thereon) from a first position before applying the first force to a second position after applying the first force may be in the nanometer range or smaller, less than a micrometer, or less than or equal to 0.2% of the vertical separation.

Moreover, based at least in part on using the first force (e.g., an electrostatic first force) to move the plate and/or plate hinges with a horizontal to vertical stiffness ratio of greater than 100, the self-aligned vertical comb drive may achieve a higher level of reliability and accordingly, a greater range of available materials may be possible for implementation of the self-aligned vertical comb drive than may be achieved using other less precisely-aligned, more complex designed, or more material restricted techniques. Furthermore, based at least in part on manufacturing structures of the plate and comb rotor using a single masking and etching step, followed by applying the first force, manufacturability may be improved relative to other techniques. In some implementations, providing a symmetrical arrangement of the plate hinges and plate anchors about the plate may ensure the plate and substrate are parallel before applying the first force, thereby further decreasing lateral variation of the plate between a first position and a second position. In some implementations, the second position of the plate may maintained without maintaining the first force. For example, after applying, for example, an electrostatic force to displace the plate, another force, such as surface adhesion force, contact adhesion force, and/or the like may maintain the position of the plate.

Figure 1A:
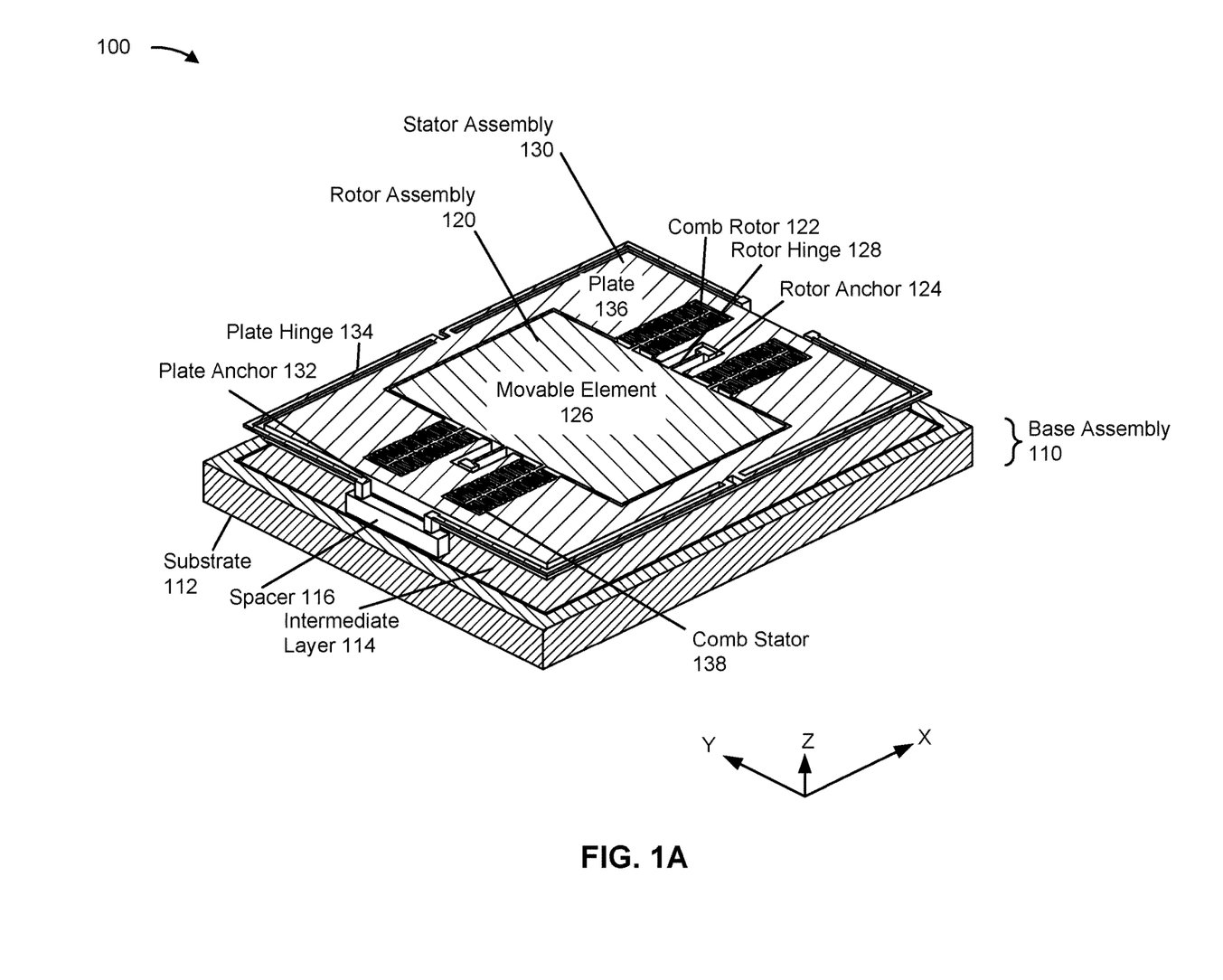
FIGS. 1A and 1B are diagrams of an example self-aligned vertical comb drive assembly, described herein.
Figure 1B:
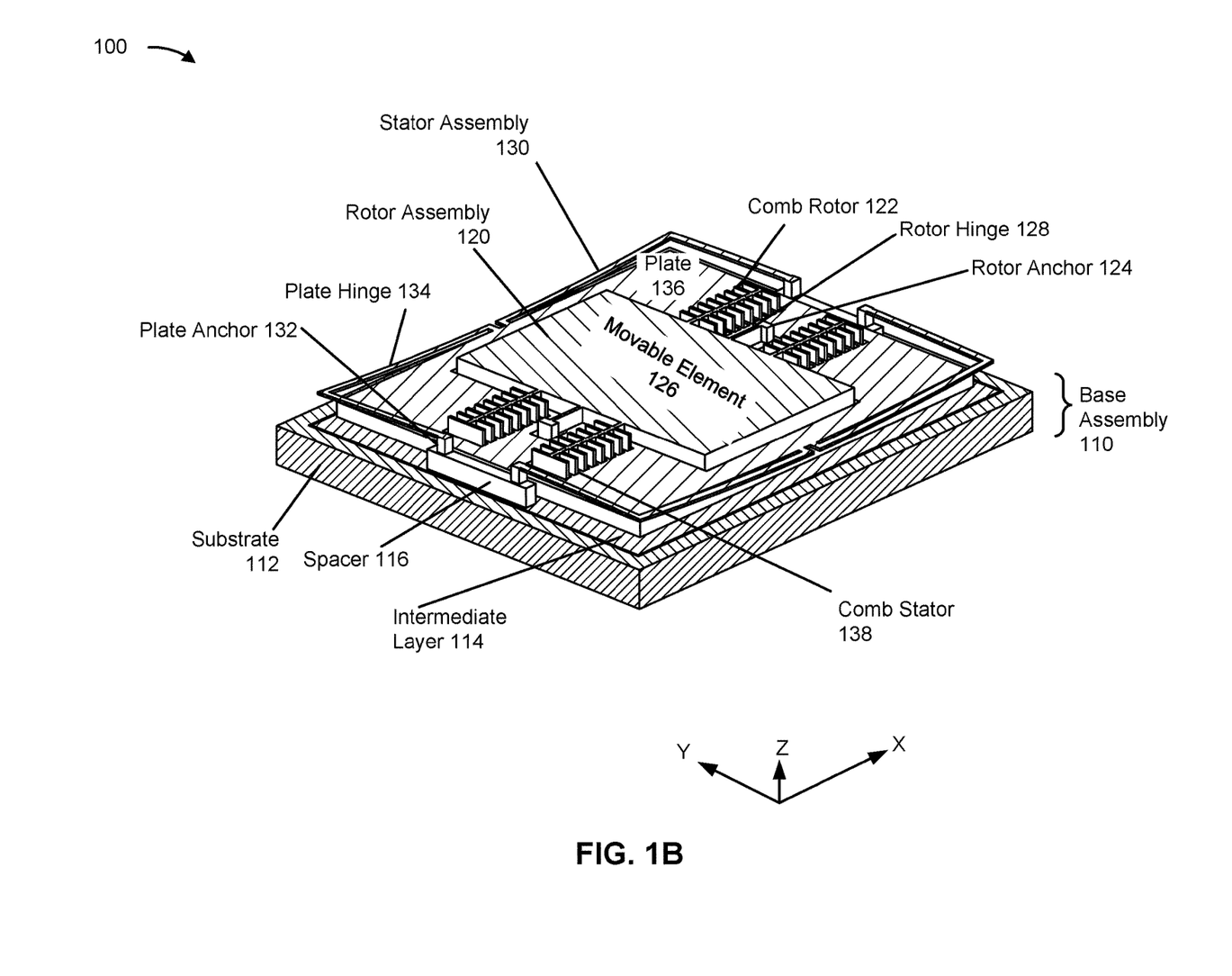

FIGS. 1A-1B are diagrams of an example of a self-aligned vertical comb drive assembly 100. As shown in FIGS. 1A-1B, self-aligned vertical comb drive assembly 100 includes a base assembly 110, a rotor assembly 120, and a stator assembly 130. In some implementations, self-aligned vertical comb drive assembly 100 may be a component of a communication system, an electrical system, an optical system, an electro-optical system, a MEMS, an imaging system, a sensing system, and/or the like.

As further shown in FIG. 1A, base assembly 110 may include a substrate 112, an intermediate layer 114, a spacer 116, and/or the like. In some implementations, intermediate layer 114 may include a silicon dioxide ($SiO_2$) layer. In some implementations, spacer 116 may include a raised structure to separate a first plane that includes rotor assembly 120 and stator assembly 130 from a second plane to which a portion of stator assembly 130 is to be displaced to separate interdigitated fingers of rotor assembly 120 and stator assembly 130, as described in more detail herein.

As further shown in FIG. 1A, rotor assembly 120 may include a comb rotor 122, a rotor anchor 124, a movable element 126, and a rotor hinge 128. Rotor anchor 124 may attach rotor assembly 120 to base assembly 110 (e.g., through a spacer layer) or part of a spacer layer may form part of rotor anchor 124. Each rotor anchor 124 may provide an anchor point for rotor assembly 120 relative to base assembly 110. For example, two rotor anchors 124 may be attached to movable element 126 (e.g. by way of rotor hinges 128), to suspend movable element 126 above a surface of base assembly 110 (e.g., above intermediate layer 114). In this case, rotor hinge 128 may movably attach movable element 126 to rotor anchor 124, thereby enabling comb rotor 122 to actuate movable element 126. Rotor hinges 128 may comprise elongated straight hinges connecting between opposite sides of movable element 126 and rotor anchors 124 to encourage rotation of movable element 126 about an axis of rotation along which the rotor anchors 124 and rotor hinges 128 are aligned. Comb rotors 122 may be attached to movable element 126 to actuate (e.g., impart rotation) to movable element 126. In some implementations, rotor assembly 120 may include a symmetrical arrangement of comb rotors 122, rotor anchors 124 and rotor hinges 128. As illustrated in FIG. 1A, comb rotor 122 may comprise four combs, arranged such that two combs are on opposite sides of movable element 126 and such that two combs are on opposite sides of rotor hinge 128. In some implementations, movable element 126 may include a mirror, a grating, a prism, and/or the like. Additionally, or alternatively, movable element 126 may include a MEMS element, an electrical element, an optical element, an electro-optical element, and/or the like.

As further shown in FIG. 1A, stator assembly 130 may include a plate anchor 132, a plate hinge 134, a plate 136, and a comb stator 138. Plate anchors 132 may connect to spacer 116 or spacer 116 may form part of plate anchors 132. Plate anchors 132 may provide anchor points for plate hinges 134 relative to base assembly 110. Plate hinges 134 may connect plate 136 to plate anchors 132. For example, stator assembly 130 may include a set of plate hinges 134 (e.g., four plate hinge elements) arranged to surround plate 136. In some implementations, the set of plate hinges 134 may be symmetrically arranged around plate 136. For example, the set of plate hinges 134 may be L shaped plate hinges symmetrically arranged around edges of plate 136 to enable vertical displacement while minimizing lateral displacement. In this case, based at least in part on the set of plate hinges 134 being symmetrically arranged and having an L shape, the set of plate hinges 134 may have greater than a threshold ratio of lateral stiffness to vertical stiffness, which may enable vertical movement (e.g., in the Z-axis) and may suppress lateral movement (e.g., in the X-axis or Y-axis). In some implementations, lateral displacement of the plate 136 from a first position to a second position may be on the order of nanometers or smaller. In some implementations, lateral displacement of the plate 136 from a first position to a second position may be less than 1 micrometer. In some implementations, vertical displacement of plate 136 from the first position to the second position may be between approximately 1 micrometer and 100 micrometers. In some implementations, lateral displacement may be less than 1%, 0.5%, 0.2%, and/or the like of vertical movement.

In some implementations, comb stators 138 and/or comb rotators 122 are formed from plate 136. For example, as described in more detail herein, a monolithic layer may be masked and etched to form, for example, at least a portion of stator assembly 130, rotor assembly 120, and/or the like. In some implementations, each plate anchor 132, of a set of plate anchors 132, may attach a corresponding plate hinge 134, of a set of plate hinges 134, to base assembly 110. For example, plate anchor 132 may be attached to spacer 116 and may attach stator assembly 130 to base assembly 110. In some implementations, a single spacer 116 may support a plurality of plate anchors 132. Additionally, or alternatively, each plate anchor 132 may attach to a corresponding spacer 116.

In some implementations, self-aligned vertical comb drive assembly 100 may be configured to achieve a threshold level of electrostatic force, a threshold level of contact adhesion force, and/or the like. For example, plate 136 may have a side length of approximately 500 micrometers (μm) and a thickness of approximately 20 μm, intermediate layer 114 may have a thickness of 2 μm, plate hinges 134 may have a stiffness of 0.1 micro-Newton per micrometer (μN/μm), and plate 134 may be displaced 20 μm under an applied voltage of 10 volts (V). In some implementations, a vertical separation of plate 136 from, for example, intermediate layer 114 may be between 1 micrometer and 100 micrometers. As a result, an inertial force may be approximately 0.1165 μN, a hinge force may be approximately 2 μN, and an electrostatic force may be approximately 421 μN. This may result in a ratio of static force (e.g., contact adhesion force, electrostatic force, and/or the like) to dynamic force (e.g., spring force) of approximately 199, providing a high level of reliability. In some implementations, the ratio of the static force to the dynamic force may be greater than approximately 100, greater than approximately 150, greater than approximately 200, and/or the like. In this way, self-aligned vertical comb drive assembly 100 may achieve greater than a threshold level of reliability.

As shown in FIG. 1B, based on applying a voltage differential between substrate 112 and plate 136, a first force (e.g., an electrostatic force, an inertial force, an aerodynamic force, and/or the like) vertically displaces plate 136 and comb stator 138. For example, plate 136 is pulled toward base assembly 110 by the first force and the set of plate hinges 134 cause plate 136 to move vertically toward base assembly 110 without moving laterally. In this way, the set of plate hinges 134 maintain an alignment between fingers of comb rotor 122 and comb stator 138. In some implementations, the first force displaces plate 136 to cause plate 136 to contact intermediate layer 114, and/or the like. For example, plate 136 may move vertically from a first plane that includes rotor assembly 120 to a second plane that includes a surface of, for example, intermediate layer 114. In some aspects, when plate 136 is moved vertically to the second plane as a response to an application of a voltage, the application of the voltage may be removed and surface adhesion force or another force may maintain plate 136 in the second plane. Plate hinges 134 may provide lateral stiffness to avoid lateral movement. In this case, fingers of comb stator 138 are vertically separated from fingers of comb rotor 122 without lateral displacement, thereby forming a staggered configuration for self-aligned vertical comb drive assembly 100. Based at least in part on preventing or minimizing lateral movement, fingers of comb stator 138 are prevented from touching fingers of comb rotor 122. In this way, fingers of comb stator 138 may be manufactured with less than a threshold gap variation with respect to fingers of comb rotor 122, thereby achieving greater than a threshold driving force on comb rotor 122, without increasing the risk that the fingers touch and equalize any electrostatic force used to drive comb rotor 122. In this way, the comb rotors 122 and comb stators 138 may not require passivation.

As indicated above, FIGS. 1A-1B are provided as an example. Other examples may differ from what is described with regard to FIGS. 1A-1B. The number and arrangement of components shown in FIGS. 1A-1B are provided as an example. In practice, there may be additional components, fewer components, different components, or differently arranged components than those shown in FIGS. 1A-1B. Furthermore, two or more components shown in FIGS. 1A-1B may be implemented within a single component, or a single component shown in FIGS. 1A-1B may be implemented as multiple, distributed component. Additionally, or alternatively, a set of components (e.g., one or more component) shown in FIGS. 1A-1B may perform one or more functions described as being performed by another set of components shown in FIGS. 1A-1B.

Figure 2:
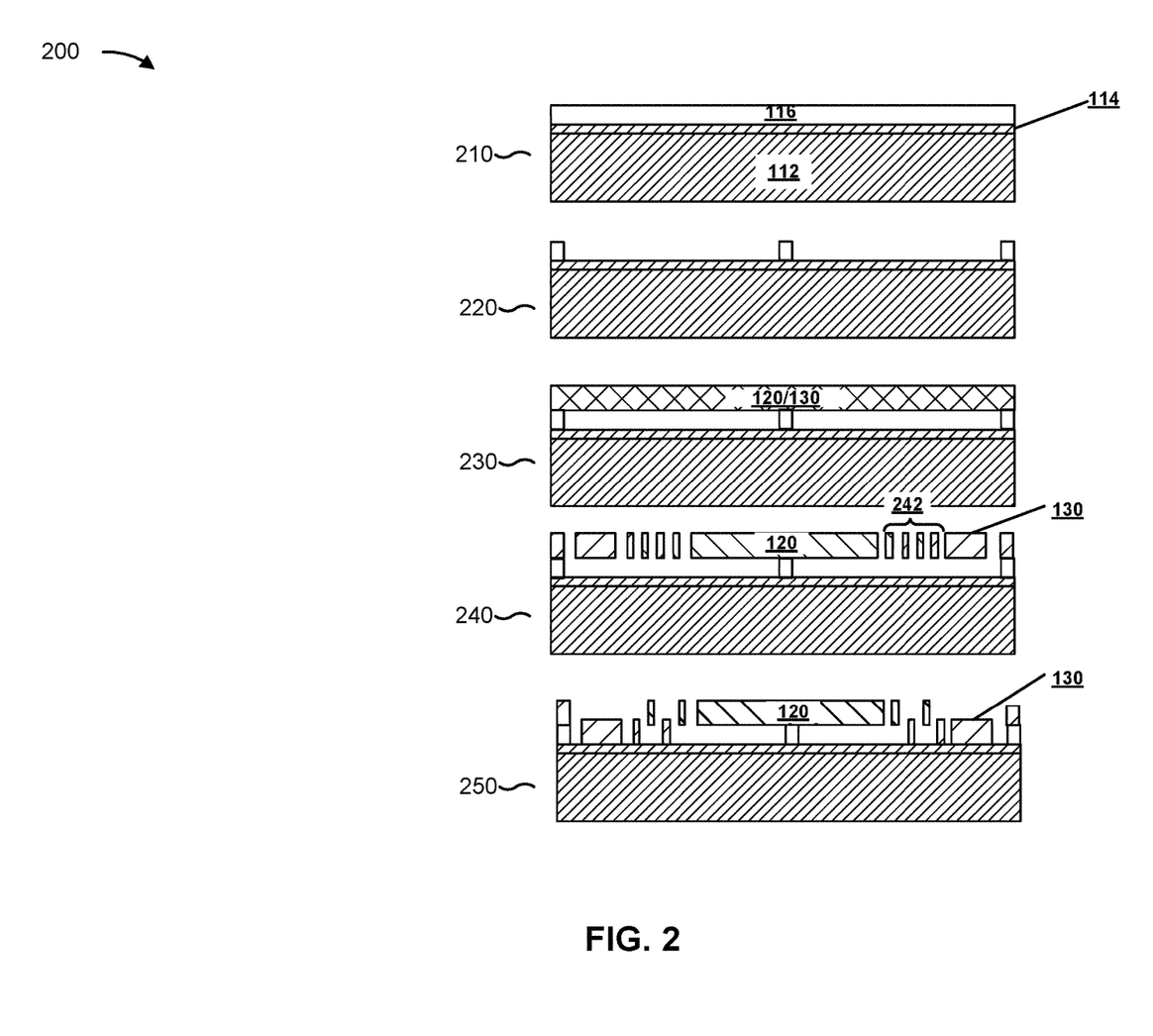
FIG. 2 is a diagram of an example process for manufacturing a self-aligned vertical comb drive assembly, described herein.

FIG. 2 is a diagram of an example process 200 associated with manufacturing a self-aligned vertical comb drive.

As shown in FIG. 2, process 200 may include disposing one or more layers onto a substrate (block 210). For example, during manufacture, a deposition device may deposit a silicon dioxide layer (e.g., intermediate layer 114) onto the substrate (e.g., substrate 112), a spacer layer (e.g., spacer 116) onto the substrate or onto the silicon dioxide layer, and/or the like. For example, a sputter deposition system may sputter silicon dioxide, silicon, and/or the like onto a silicon on insulator substrate.

As further shown in FIG. 2, process 200 may include defining anchor posts (block 220). For example, during manufacture, an etching device may etch the spacer to form anchor posts (e.g., spacer 116, plate anchor 132, rotor anchor 124, and/or the like) for a rotor assembly (e.g., rotor assembly 120), a stator assembly (e.g., stator assembly 130), and/or the like.

As further shown in FIG. 2, process 200 may include disposing a top layer onto the anchor posts (block 230). For example, during manufacture, a bonding device may bond a silicon layer to the anchor posts and/or spacer 116. In this case, the silicon layer may be used to form at least a portion of rotor assembly 120, stator assembly 130, and/or the like.

As further shown in FIG. 2, process 200 may include defining top structures (block 240). For example, during manufacture, a masking device and/or an etching device may shape the silicon layer to form a rotor assembly, a stator assembly, and/or the like. As shown by reference number 242, a comb rotor (e.g., comb rotor 122) and/or a comb stator (e.g., comb stator 138) is formed from the silicon layer. In some implementations, a portion of the rotor anchor 124 and/or plate anchor 132 may also be formed from the silicon layer. In some implementations, the silicon layer may be shaped using an etching process and/or a masking process. For example, a mask may be deposited onto the silicon layer and an etching process may be applied to remove a first portion of the silicon layer. In this case, based at least in part on removing the first portion of the silicon layer, a remaining second portion of the silicon layer may form, for example, plate hinge 134, plate 136, comb stator 138, comb rotor 122, movable element 126, and/or the like. Additionally, or alternatively, another process may be used to shape the silicon layer, such as a cutting progress (e.g., a laser cutting process), a deposition process, and/or the like. In this way, using a precise shaping procedure to form a common layer of material for both a comb rotor and a comb stator, a gap between fingers of the comb rotor and fingers of the comb stator may be reduced to less than a threshold gap, such as less than 20 micrometers (μm), less than 10 μm, less than 5 μm, and/or the like. By achieving less than a threshold gap, a larger driving force may be achieved as electrostatic driving force is inversely proportional to gap size. Moreover, a smaller gap may enable a greater quantity of fingers in a comb in a given amount of space, thereby achieving a greater driving force than is achievable with fewer fingers. In the configuration illustrated in block 240, the stator assembly 130 (including plate 136) is in a common plane with the rotor assembly 120 and the plate 136 is in a first position.

As further shown in FIG. 2, process 200 may include separating comb fingers (block 250). For example, after or during manufacture, a control device may apply a first force to self-aligned vertical comb drive assembly 100 to displace plate 136 and comb stator 138 from a first position in which plate 136 and comb stator 138 are in the same, first plane as rotor assembly 120 to a second position in which rotor assembly 120 remains in the first plane and plate 136 and comb stator 138 are in a second plane that is different from the first plane. In some aspects, when plate 136 is in the second position, the control device may remove the first force, such as an electrostatic force, and another force, such as surface adhesion force and/or the like, may maintain plate 136 in the second position. After applying the first force, such as during operation, a control device (e.g., the same control device or a different control device) may apply a second force (e.g., another electrostatic force) to actuate self-aligned vertical comb drive assembly 100.

Although FIG. 2 shows example blocks of process 200, in some implementations, process 200 may include additional blocks, fewer blocks, different blocks, or differently arranged blocks than those depicted in FIG. 2. Additionally, or alternatively, two or more of the blocks of process 200 may be performed in parallel.

Figure 3:
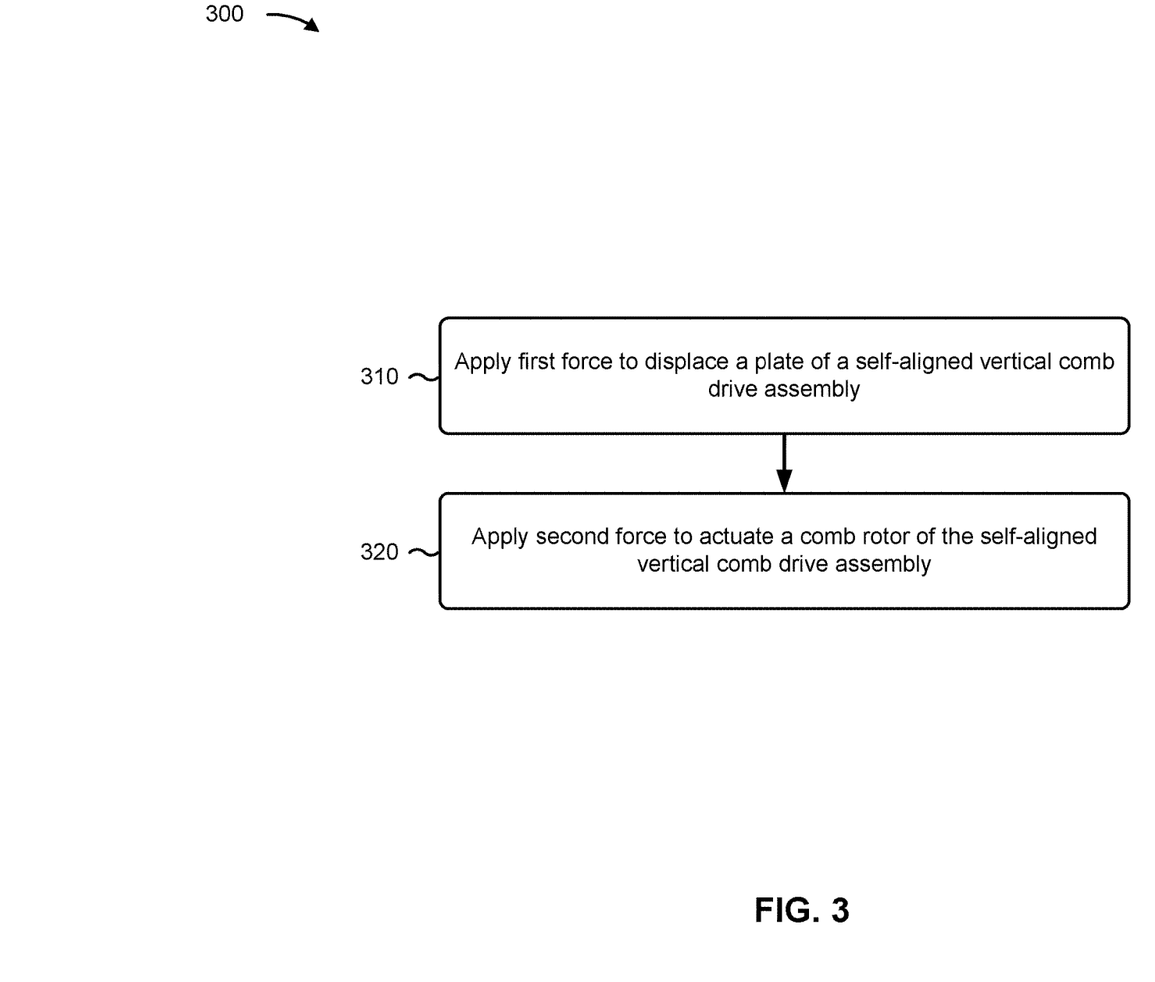
FIG. 3 is a flow chart of an example process relating to operating a self-aligned vertical comb drive assembly, described herein.

FIG. 3 is a flow chart of an example process 300 associated with operating a self-aligned vertical comb drive assembly. In some implementations, one or more process blocks of FIG. 3 may be performed by a control device. In some implementations, one or more process blocks of FIG. 3 may be performed by another device or a group of devices separate from or including the control device.

As shown in FIG. 3, process 300 may include applying a first force to displace a plate of a self-aligned vertical comb drive assembly (block 310). For example, the control device may apply a first electrostatic force, a first inertial force, a first aerodynamic force, and/or the like to a vertical comb drive assembly to move a plate, of the vertical comb drive assembly, from a first position, as described above. In some implementations, a comb rotor, of the vertical comb drive assembly, and a comb stator, of the vertical comb drive assembly, are both in a first plane to a second position. In some implementations, the comb rotor is in the first plane and the comb stator is in a second plane that is parallel to the first plane. In some implementations, the comb stator is formed by the plate. In some implementations, the control device may maintain the first force. For example, the control device may maintain an electrostatic force applied to the self-aligned vertical comb drive assembly to maintain a position of the plate. In some implementations, the control device may remove the first force. For example, the control device may apply an electrostatic force to displace the plate, at which point the control device may remove the electrostatic force. In this case, another force, such as a surface adhesion force may maintain the vertical position of the plate.

As further shown in FIG. 3, process 300 may include applying a second force to actuate a comb rotor of the self-aligned vertical comb drive assembly (block 320). For example, the control device may apply, after applying the first force to move the plate from the first position to the second position, a second force to the vertical comb drive assembly to actuate the comb rotor relative to the comb stator, as described above. In some implementations, the second force is an electrostatic force and/or the like.

Process 300 may include additional implementations, such as any single implementation or any combination of implementations described below and/or in connection with one or more other processes described elsewhere herein.

In a first implementation, the first force is normal to the plate. In a second implementation, alone or in combination with the first implementation, applying the first force comprises displacing the plate vertically from the first position to the second position. In a third implementation, alone or in combination with one or more of the first and second implementations, process 300 includes maintaining, using at least one of a contact adhesion force or the first force, the plate at the second position during the applying of the second force. In a fourth implementation, alone or in combination with one or more of the first through third implementations, the plate, in the second position, is in contact with a substrate of the vertical comb drive assembly.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical comb drive assembly, comprising:
   a rotor assembly, comprising:
      a rotor anchor attached to a base,
      a comb rotor attached to a moveable element, and
      a rotor hinge attached to the rotor anchor and attached to the moveable element to enable rotation of the moveable element about a single axis that bisects the moveable element; and
   a stator assembly, comprising:
      a plate anchor attached to the base,
      a plate, wherein the plate forms a comb stator, and
      a plate hinge to connect the plate to the plate anchor, wherein the plate hinge is configured for translating the plate vertically from a first position to a second position,
   wherein, in the first position, the comb rotor and the comb stator are both in a first plane, and in the second position, the comb rotor is in the first plane and the comb stator is in a second plane that is parallel to the first plane, and
   wherein the comb rotor includes a first set of fingers that interact with a second set of fingers included in the comb stator in at least one of the first position or the second position.

2. The vertical comb drive assembly of claim 1, further comprising:
   a base assembly, comprising:
      the base, wherein the base is a substrate; and
      a spacer disposed on the substrate.

3. The vertical comb drive assembly of claim 2, further comprising:
   a silicon dioxide layer disposed between the substrate and the spacer.

4. The vertical comb drive assembly of claim 1, wherein the rotor assembly and the stator assembly are formed from a common layer of material.

5. The vertical comb drive assembly of claim 1, wherein the plate hinge is configured to provide one degree of freedom of movement to the plate.

6. The vertical comb drive assembly of claim 1, wherein a lateral variation of the plate from the first position to the second position is less than or equal to 0.2% of a vertical separation between the first position and the second position.

7. The vertical comb drive assembly of claim 1, wherein the second set of fingers is alignable, at the second position, to the first set of fingers.

8. The vertical comb drive assembly of claim 1, wherein the plate is held in the second position by contact adhesion force with the base.

9. The vertical comb drive assembly of claim 1, wherein a gap, at the second position, between the first set of fingers and the second set of fingers, is less than 5 micrometers.

10. The vertical comb drive assembly of claim 1, wherein an arrangement of the plate hinge and the plate anchor around the plate is symmetrical relative to the single axis.

11. The vertical comb drive assembly of claim 1, wherein a gap, at the second position, between the first set of fingers and the second set of fingers is less than 10 micrometers.

12. A method, comprising:
applying a first force to a vertical comb drive assembly to translate a plate, of the vertical comb drive assembly, vertically from a first position wherein a comb rotor, of the vertical comb drive assembly, and a comb stator, of the vertical comb drive assembly, are both in a first plane, to a second position wherein the comb rotor is in the first plane and the comb stator is in a second plane that is parallel to the first plane,
  wherein the first position is distal from a base of the vertical comb drive assembly and the second position is proximal to the base,
  wherein the comb stator is formed by the plate,
  wherein the comb rotor is included in a rotor assembly, the rotor assembly comprising:
    a rotor anchor attached to the base, and
    a moveable element attached to the comb rotor, and
    a rotor hinge attached to the rotor anchor and attached to the moveable element to enable rotation of the moveable element about a single axis that bisects the moveable element;
  wherein the comb stator and the plate are included in a stator assembly, the stator assembly comprising:
    a plate anchor attached to the base, and
    one or more plate hinges to connect the plate to the plate anchor and enable translating the plate vertically from the first position to the second position; and
applying, after applying the first force to move the plate from the first position to the second position, a second force to the vertical comb drive assembly to actuate the comb rotor relative to the comb stator,
  wherein the comb rotor includes a first set of fingers that interact with a second set of fingers included in the comb stator in at least one of the first position or the second position.

13. The method of claim 12, wherein applying the first force to the vertical comb drive assembly to move the plate comprises applying an electrostatic force to the vertical comb drive assembly.

14. The method of claim 12, further comprising:
restricting, by the plate hinges, lateral movement of the plate; and
providing the plate hinges with a threshold ratio of lateral stiffness to vertical stiffness.

15. The method of claim 12, further comprising:
maintaining, the plate at the second position using at least one of a contact adhesion force, a surface adhesion force, or an electrostatic force.

16. The method of claim 12, wherein the plate, in the second position, is in contact with the base of the vertical comb drive assembly.

17. A vertical comb drive assembly, comprising:
a base assembly, comprising
  a substrate and a spacer disposed on the substrate;
a rotor assembly, comprising:
  a rotor anchor attached to the spacer,
  a comb rotor attached to the rotor anchor and attached to a moveable element by a rotor hinge that enables rotation of the moveable element about a single axis that bisects the moveable element,
    wherein the comb rotor includes a first set of fingers; and
a stator assembly, comprising:
  a plate anchor attached to the spacer,
  a plate,
  a plate hinge to connect the plate to the plate anchor,
  a comb stator formed from the plate,
    wherein the comb stator includes a second set of fingers to interact with the first set of fingers,
  wherein the plate hinge and the plate are movable such that the plate is capable of translating vertically from a first position, wherein the comb rotor and the comb stator are both in a first plane, to a second position, wherein the comb rotor is in the first plane and the comb stator is in a second plane that is parallel to the first plane.

18. The vertical comb drive assembly of claim 17, wherein the plate hinge comprises:
at least one first hinge element attached to at least one corresponding plate anchor element of the plate anchor and attached to a first edge of the plate; and
at least one second hinge element attached to at least one corresponding plate anchor element of the plate anchor and attached to a second edge of the plate.

19. The vertical comb drive assembly of claim 17, wherein the plate hinge comprises a set of four plate hinge elements surrounding the plate and providing one degree of freedom of movement for the plate.

20. The vertical comb drive assembly of claim 17, further including a movable element that is at least one of:
a microelectromechanical system,
an electrical element,
an optical element, or
an electro-optical element.

21. The vertical comb drive assembly of claim 17, wherein a movable element of the rotor assembly is aligned to at least one other element of a system, wherein the system is at least one of:
a microelectromechanical system,
a communication system,
an optical system,
an electrical system,
an electro-optical system,
a sensing system, or
an imaging system.

22. The vertical comb drive assembly of claim 17, wherein a lateral variation in position of the plate from the first position to the second position, is less than 0.2% of a vertical separation of the plate from the first position to the second position.

* * * * *